United States Patent
Rangan et al.

(10) Patent No.: US 7,737,795 B2
(45) Date of Patent: Jun. 15, 2010

(54) VOLTAGE CONTROLLED OSCILLATOR

(76) Inventors: Giri N. K. Rangan, 9910 Jasmine Creek Dr., Austin, TX (US) 78726; Earl E. Swartzlander, Jr., 80 Red River St., #314, Austin, TX (US) 78701

( * ) Notice: Subject to any disclaimer, the term of this patent is extended or adjusted under 35 U.S.C. 154(b) by 50 days.

(21) Appl. No.: 11/946,932

(22) Filed: Nov. 29, 2007

(65) Prior Publication Data

US 2008/0129393 A1    Jun. 5, 2008

Related U.S. Application Data

(60) Provisional application No. 60/867,948, filed on Nov. 30, 2006.

(51) Int. Cl.
  *H03K 3/03*   (2006.01)
  *H03H 11/26*  (2006.01)
(52) U.S. Cl. .................. 331/57; 331/183; 327/261; 327/266
(58) Field of Classification Search ............ 331/57, 331/177 R, 182, 183; 327/149, 153, 158, 327/161, 178, 180, 261, 266, 287
See application file for complete search history.

(56) References Cited

U.S. PATENT DOCUMENTS

| 5,191,301 | A   | 3/1993  | Mullgrav |
|-----------|-----|---------|----------|
| 5,635,878 | A   | 6/1997  | Liu et al. |
| 5,638,030 | A   | 6/1997  | Du |
| 5,994,969 | A   | 11/1999 | Bujanos |
| 6,215,364 | B1* | 4/2001  | Hwang et al. ............ 331/57 |
| 6,469,585 | B1* | 10/2002 | Dai et al. .............. 331/57 |
| 7,315,220 | B1* | 1/2008  | Robinson et al. ......... 331/100 |
| 2006/0214739 | A1* | 9/2006 | Kang ................. 331/57 |
| 2007/0152763 | A1* | 7/2007 | Mansuri ............... 331/57 |

FOREIGN PATENT DOCUMENTS

EP          0905989 A1    3/1999

OTHER PUBLICATIONS

International Preliminary Report on Patentability for PCT/US2007/086000, mailed Jun. 11, 2009, 4 pages.
International Search Report and Written Opinion for PCT/US2007/086000, mailed May 22, 2008, 7 pages.

(Continued)

*Primary Examiner*—Robert Pascal
*Assistant Examiner*—Ryan J. Johnson
(74) *Attorney, Agent, or Firm*—Schwabe, Williamson & Wyatt, P.C.

(57)               ABSTRACT

A ring oscillator based voltage controlled oscillator (VCO) is disclosed. The VCO includes a set of delay cells connected to each other in a ring configuration. Each of the delay cells includes a source-coupled input transistor pair, a current-steering transistor pair and a pair of load resistors. The source-coupled input transistor pair receives a pair of differential voltage inputs. The load resistors, which are connected to the source-coupled input transistor pair, provide a pair of differential voltage outputs. The current-steering transistor pair, which is connected to the source-coupled input transistor pair, receives a pair of differential bias voltage inputs. The output frequency of the VCO is directly proportional to the differential bias voltages at the pair of differential bias voltage inputs.

12 Claims, 4 Drawing Sheets

OTHER PUBLICATIONS

Yang, C. K. K., "Design of High-Speed Serial Links in CMOS," Stanford University, Dec. 1998, 181 pages.

Razavi, B., "A 2-GHz 1.6-mW Phase-Locked Loop," IEEE Journal of Solid-State Circuits, May 1997, pp. 730-735, vol. 32, No. 5.

Lee, S. J. et al., "A Fully Integrated Low-Noise 1-GHz Frequency Synthesizer Design for Mobile Communication Application," IEEE Journal of Solid-State Circuits, May 1997, pp. 760-765, vol. 32, No. 5.

Ahn, H. T. et al., "A Low-Jitter 1.9-V CMOS PLL for UltraSPARC Microprocessor Applications," IEEE Journal of Solid-State Circuits, Mar. 2000, pp. 450-454, vol. 35, No. 3.

Von Kaenel, V. et al., "A 320 MHz, 1.5 mW @ 1.35 V CMOS PLL for Microprocessor Clock Generation," IEEE Journal of Solid-State Circuits, Nov. 1996, pp. 1715-1722, vol. 31, No. 11.

Lee, K. et al., "A Single-Chip 2.4-GHz Direct-Conversion CMOS Receiver for Wireless Local Loop using Multiphase Reduced Frequency Conversion Technique," IEEE Journal of Solid-State Circuits, May 2001, pp. 800-809, vol. 36, No. 5.

Maneatis, J. et al., "Self-Biased High-Bandwidth Low-Jitter 1-to-4096 Multiplier Clock Generator PLL," IEEE Journal of Solid-State Circuits, Nov. 2003, pp. 1795-1803, vol. 38, No. 11.

Mansuri, M., "A Low-Power Low-Jitter Adaptive-Bandwidth PLL and Clock Buffer," IEEE International Solid-State Circuits Conference 2003, Feb. 2003, 10 pages.

Tak, G. Y. et al., "A 6.3-9-GHz CMOS Fast Settling PLL for MB-OFDM UWB Applications," IEEE Journal of Solid State Circuits, Aug. 2005, pp. 1671-1679, vol. 40, No. 8.

Rangan, G., "A Fractional N Frequency Synthesizer for an Adaptive Network Backplane Serial Communication System," The University of Texas at Austin, Dec. 2005, 144 pages. Publicly available from UoT on Aug. 28, 2008.

* cited by examiner

VOLTAGE CONTROLLED OSCILLATOR

PRIORITY CLAIM

The present application claims priority under 35 U.S.C. § 119(e)(1) to provisional application No. 60/867,948 filed on Nov. 30, 2006, the contents of which are incorporated herein by reference.

BACKGROUND OF THE INVENTION

1. Technical Field

The present invention relates to digital circuits in general, and in particular to voltage controlled oscillators. Still more particularly, the present invention relates to a voltage controlled oscillator having common-mode feedbacks and differential controls.

2. Description of Related Art

A voltage controlled oscillator (VCO) is an extremely sensitive, high-gain analog circuit. For silicon implementations, the common VCO architectures have been ring oscillators and inductor-capacitor (LC) oscillators.

Ring oscillators are relaxation oscillators that do not require resonant elements such as crystals. Although ring oscillators have many advantages such as wide tuning-ranges, small footprints, etc., they tend to have a relatively high phase noise or timing jitter, which is largely caused by the lack of a high-gain tuned element such as an LC tank.

LC oscillators tend to perform much better in wireless and radio-frequency communication systems that require a local oscillator to generate a pure sinusoid signal. However, for wired serial transceivers that depend on the availability of multiple phases of a serial clock to provide clock recovery/synchronization, ring oscillators are definitely preferred over LC oscillators. This is because a four-stage ring oscillator can, for example, readily generate eight phases of a high-quality, high-frequency clock, but the generation of different phases of a high-frequency clock is a much more difficult task for LC oscillators.

The present disclosure provides an improved ring oscillator based VCO with low jitter for wired serial transceiver applications.

SUMMARY OF THE INVENTION

In accordance with a preferred embodiment of the present invention, a voltage controlled oscillator (VCO) includes a set of delay cells connected to each other in a ring configuration. Each of the delay cells includes a source-coupled input transistor pair, a current-steering transistor pair and a pair of load resistors. The source-coupled input transistor pair receives a pair of differential voltage inputs. The load resistors, which are connected to the source-coupled input transistor pair, provide a pair of differential voltage outputs. The current-steering transistor pair, which is connected to the source-coupled input transistor pair, receives a pair of differential bias voltage inputs. The output frequency of the VCO is directly proportional to the differential bias voltages at the pair of differential bias voltage inputs.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
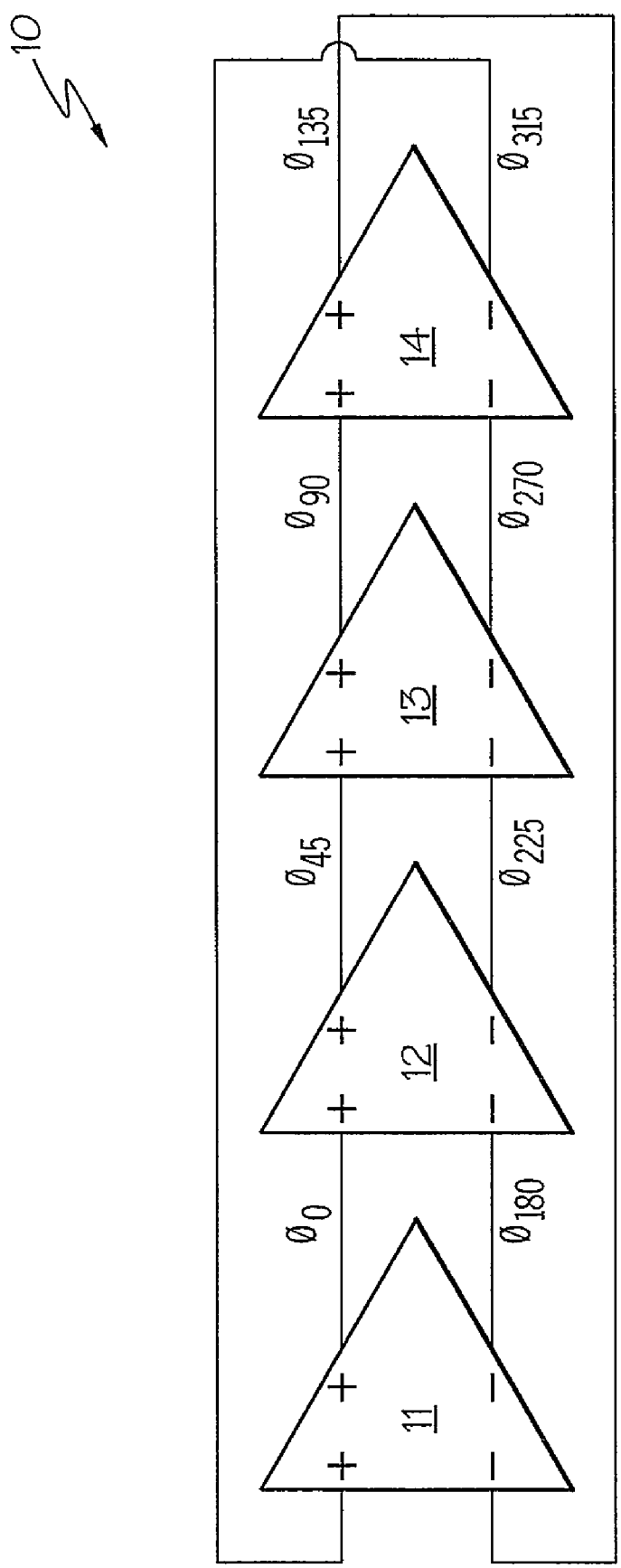
FIG. 1 is a block diagram a ring oscillator based voltage controlled oscillator (VCO), in accordance with a preferred embodiment of the present invention.

Referring now to the drawings and in particular to FIG. 1, there is depicted a block diagram of a ring oscillator based voltage controlled oscillator (VCO), in accordance with a preferred embodiment of the present invention. As shown, a VCO 10 includes four delay cells 11-14 connected to each other in a ring configuration. With delay cells 11-13, the positive/negative outputs are connected to the positive/negative inputs of their adjacent delay cell accordingly. With delay cell 14, the positive output is connected to the negative input of delay cell 11, and the negative output is connected to the positive input of delay cell 11. Eight different phases (e.g., $\phi_0$, $\phi_{45}$, $\phi_{90}$, $\phi_{135}$, $\phi_{180}$, $\phi_{225}$, $\phi_{270}$ and $\phi_{315}$) of a high-frequency clock can be obtained at corresponding outputs of delay cells 11-14.

Each of delay cells 11-14 is a differential delay (or transconductance) stage implemented with fully differential circuits to take advantage of their superior power supply rejection ratio (PSRR) and common-mode rejection ratio (CMRR) performance and inherent noise immunity. The delay time $t_d$ of each of delay cells 11-14 can be controlled by varying the bias current of each corresponding delay cell. The delay time $t_d$ is given by $$t_d = \frac{V_{sw} C_{load}}{I_{bias}}$$

where $I_{bias}$ is the bias current of each delay cell, $C_{load}$ is the total load capacitance at the output of each delay cell, and $V_{sw}$ is the voltage swing.

Figure 2:
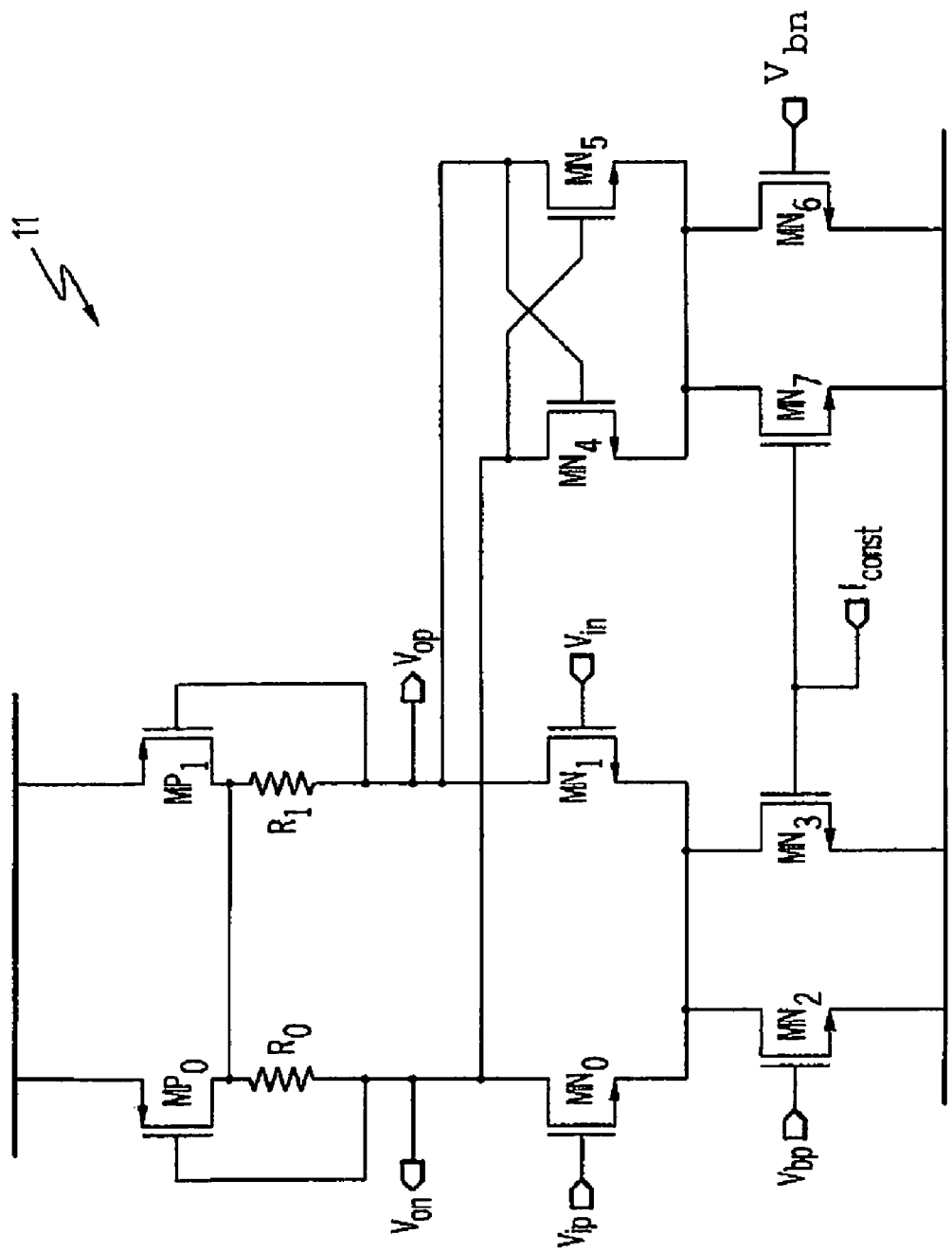
FIG. 2 is a schematic diagram of a delay cell within the VCO from FIG. 1, in accordance with a preferred embodiment of the present invention.

Since delay cells 11-14 are identical to each other, only delay cell 11 will be further described in detail. With reference now to FIG. 2, there is depicted a schematic diagram of delay cell 11, in accordance with a preferred embodiment of the present invention. As shown, a delay cell 11 includes a source-coupled n-channel input transistor pair $MN_0$-$MN_1$ along with their respective load resistors $R_0$ and $R_1$. P-channel transistors $MP_0$ and $MP_1$ operate in their linear region and provide continuous-time common-mode feedback to keep the direct current (DC) level at outputs $V_{op}$ and $V_{on}$ constant.

The major drawback of most prior art delay cells is that the DC levels at the outputs of prior art delay cells also vary and can cause common-mode range problems. In order to avoid such common-mode range problems, prior art delay cells either operate with a very limited dynamic range (tail current variation) or require a parallel control path to adjust for the DC level variations. The common-mode feedback feature in delay cell 11 eliminates the common-mode range problems in most of the prior art delay cells.

Another feature incorporated within delay cell 11 is the delay variation with positive feedback. The cross-coupled n-channel transistor pair $MN_4$-$MN_5$ form a negative resistance pair that appear in parallel with resistors $R_0$ and $R_1$. Suppose that transistor pair $MN_4$-$MN_5$ presents a small signal resistance of $-R_n$, and let $R_0 = R_1 = R_p$, then the equivalent resistance at outputs $V_{op}$ and $V_{on}$ is given by $(R_p R_n)/(R_n - R_p)$, which is more positive if $|R_n| > |R_p|$.

Figure 3A:
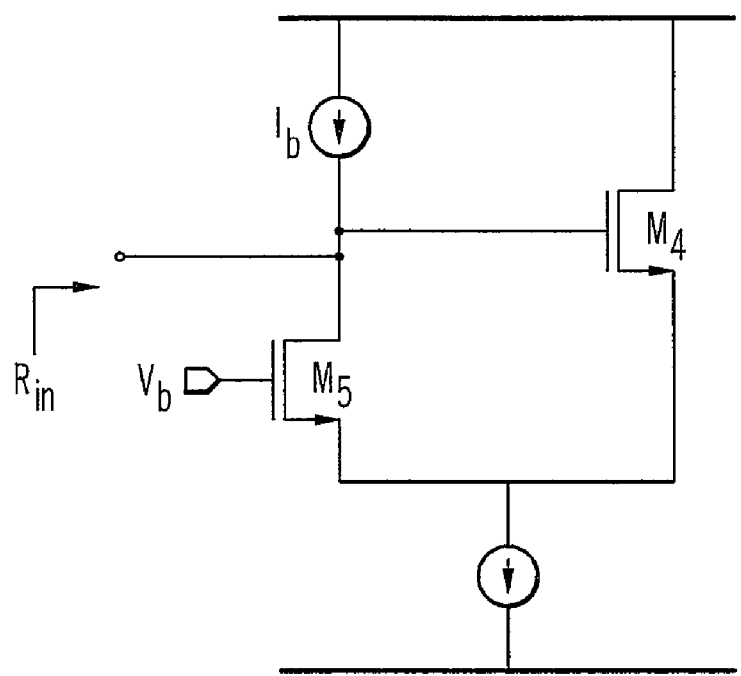
FIGS. 3a-3b are conceptual circuits for deriving the concept of introducing negative resistance via a cross-coupled transistor pair within the delay cell from FIG. 2.
Figure 3B:
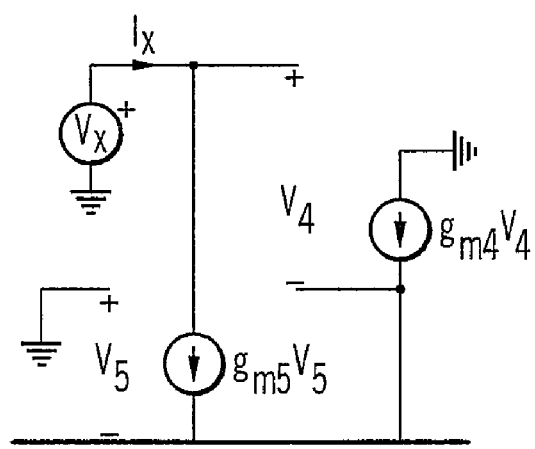

The concept of introducing negative resistance via cross-coupled transistor pair $MN_4$-$MN_5$ is derived using the conceptual circuit shown in FIG. 3a and its small signal equivalent circuit shown in FIG. 3b. From the equivalent circuits in FIGS. 3a-3b, $$I_x = g_{m4} V_4 = -g_{m5} V_5$$

and $$V_x = V_5 - V_4 = -\frac{I_x}{g_{m4}} - \frac{I_x}{g_{m5}}$$

The equivalent input resistance can then be calculated as $$\frac{V_x}{I_x} = -\frac{2}{g_m}$$

where $g_{m4} = g_{m5} = g_m$ is assumed.

The negative resistance is an incremental quantity, indicating that if the voltage applies to delay cell 11 increases, the current drawn by delay cell 11 decreases. As the total tail current in cross-coupled transistor pair $MN_4$-$MN_5$ in FIG. 2 (i.e., sum of drain currents of transistors $MN_6$ and $MN_7$) increases, the small signal differential resistance $-2/g_m$ becomes less negative, and the equivalent resistance at outputs $V_{op}$ and $V_{on}$, given by $R_p/(1-g_m R_p)$, also increases, thereby lowering the output frequency of delay cell 11.

Delay cell 11 incorporates differential current steering to maintain a fairly constant output swing at outputs $V_{op}$ and $V_{on}$. The differential current steering is achieved by varying bias voltages $V_{bp}$ and $V_{bn}$ differentially between transistors $MN_2$ and $MN_6$ in FIG. 2. The total tail current in each of source-coupled transistor pairs $MN_0$-$MN_1$, and $MN_4$-$MN_5$ is given by the sum of a constant current produced by transistors $MN_3$ and $MN_7$, respectively, and the controlled currents produced by transistors $MN_2$ and $MN_6$, respectfully.

Figure 4:
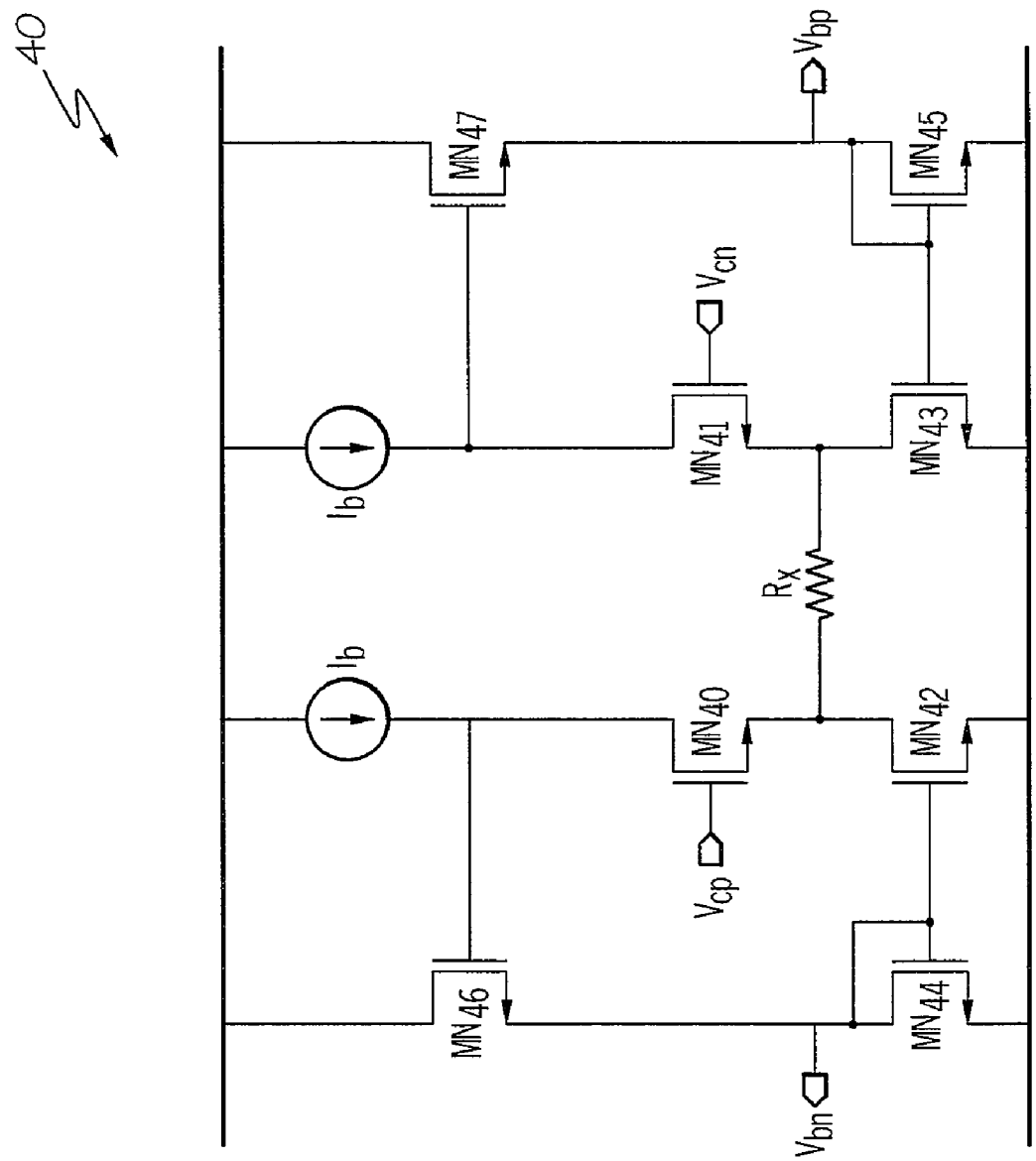
FIG. 4 is a schematic diagram of a differential control voltage circuit for generating bias voltages for the delay cell from FIG. 2, in accordance with a preferred embodiment of the present invention.

With reference now to FIG. 4, there is depicted a schematic diagram of a differential control voltage circuit for generating bias voltages $V_{bp}$ and $V_{bn}$ to supply delay cell 11 from FIG. 2, in accordance with a preferred embodiment of the present invention. As shown, a differential control voltage circuit 40 includes a differential n-channel transistor pair $MN_{41}$-$MN_{42}$ with their sources coupled to each other via a resistor $R_x$. Differential control voltage circuit 40 includes inputs $V_{cp}$ and $V_{cn}$ that are the differential outputs of a charge pump and a loop filter.

At quiescent condition when $V_{cp} = V_{cn}$, the current through resistor $R_x$ is zero. Any differential voltage $\Delta v$ applied between $V_{cp}$ and $V_{cn}$ will cause a corresponding differential current $\Delta i$ to flow through resistor $R_x$. Such differential current $\Delta i$ should flow through either transistor $MN_{46}$ or transistor $MN_{47}$, and in turn, either gate voltage $V_{bn}$ or gate voltage $V_{bp}$ will change accordingly to accommodate the current change in order to establish a differential control voltage for VCO 10 from FIG. 1.

As has been described, the present invention provides a VCO having common-mode feedbacks and differential controls.

While the invention has been particularly shown and described with reference to a preferred embodiment, it will be understood by those skilled in the art that various changes in form and detail may be made therein without departing from the spirit and scope of the invention.

What is claimed is:

1. A voltage-controlled oscillator (VCO), comprising:
   a plurality of delay cells in a ring configuration, wherein each of the plurality of delay cells includes:
      a pair of differential bias voltage inputs;
      a source-coupled input transistor pair configured to receive a pair of differential voltage inputs;
      a pair of load resistors coupled to the source-coupled input transistor pair and configured to provide differential voltage outputs;
      a first common-mode feedback transistor having a gate coupled to a first output of the differential voltage outputs and a source and drain in series with a first of the pair of load resistors;
      a second common-mode feedback transistor having a gate coupled to a second output of the differential voltage outputs and a source and drain in series with a second of the pair of load resistors; and
      a current-steering transistor pair coupled to the source-coupled input transistor pair;
      wherein the VCO is configurable to have an output frequency that is based at least on bias voltages applied to the differential bias voltage inputs.

2. The VCO of claim 1, wherein the VCO includes a total of X delay cells, wherein X is and even integer.

3. The VCO of claim 1, wherein one of the delay cells includes a positive output coupled to a negative input of another one of the delay cells, and a negative output coupled to a positive input of the another one of the delay cells.

4. The VCO of claim 3, wherein the delay cells, other than the one of the delay cells, include positive outputs coupled to positive inputs of adjacent delay cells and negative outputs coupled to negative inputs of the adjacent delay cells.

5. The VCO of claim 1, wherein the source-coupled input transistor pair comprises two substantially identical transistors.

6. The VCO of claim 1, wherein the pair of load resistors are substantially identical to each other.

7. The VCO of claim 1, wherein the current-steering transistor pair comprises two substantially identical cross-coupled transistors.

8. An apparatus, comprising:
   a voltage-controlled oscillator (VCO) having a plurality of delay cells in a ring configuration, wherein each of the plurality of delay cells includes:
      a pair of load resistors configured to provide differential voltage outputs;
      a first common-mode feedback transistor having a first terminal coupled to receive a first of the differential voltage outputs, and having second and third terminals coupled in series with a first of the pair of load resistors; and
      a second common-mode feedback transistor having a first terminal coupled to receive a second of the differential voltage outputs, and having second and third terminals coupled in series with a second of the pair of load resistors;

wherein the VCO is configurable to have an output frequency that is based at least on bias voltages applied to differential bias voltage inputs of the VCO.

9. The apparatus of claim 8, further comprising:
an input transistor pair configured to receive the differential voltage inputs and coupled to the pair of load resistors; and
a current-steering transistor pair coupled to the input transistor pair.

10. The apparatus of claim 8, wherein a total number of the delay cells in the ring configuration is an even number.

11. The apparatus of claim 8, wherein the first terminals of the first and second common-mode feedback transistors include a gate, wherein the second terminals of the first and second common-mode feedback transistors include a source, and wherein the third terminals of the first and second common-mode feedback transistors include a drain.

12. The apparatus of claim 8 wherein one of the delay cells includes a positive output coupled to a negative input of another one of the delay cells, and a negative output coupled to a positive input of the another one of the delay cells.

* * * * *